(12) United States Patent
Carter et al.

(10) Patent No.: US 11,159,262 B2
(45) Date of Patent: Oct. 26, 2021

(54) DECODER

(71) Applicant: Heron Electric Company Limited, Sussex (GB)

(72) Inventors: James Alexander Carter, West Sussex (GB); David Jeffery Carter, West Sussex (GB)

(73) Assignee: Heron Electric Company Limited, Sussex (GB)

( * ) Notice: Subject to any disclaimer, the term of this patent is extended or adjusted under 35 U.S.C. 154(b) by 115 days.

(21) Appl. No.: 16/526,429

(22) Filed: Jul. 30, 2019

(65) Prior Publication Data

US 2020/0044759 A1 Feb. 6, 2020

(30) Foreign Application Priority Data

Jul. 31, 2018 (GB) ...................................... 1812452

(51) Int. Cl.
*H04J 1/08* (2006.01)
*H03M 13/37* (2006.01)

(52) U.S. Cl.
CPC ............. *H04J 1/085* (2013.01); *H03M 13/37* (2013.01)

(58) Field of Classification Search
CPC .......... H04J 1/085; H03M 13/37; H04B 3/54; H04B 2203/5416; G05B 19/0426; G05B 2219/2625; G05B 2219/25314; G05B 2219/23339; G05B 2219/23312; G05D 7/0676; G05D 7/0617; Y10T 307/625; Y10T 307/858; Y10T 137/86389; A01G 25/16; A01G 25/162; F16K 27/006; F16K 31/402

See application file for complete search history.

(56) References Cited

U.S. PATENT DOCUMENTS

| 10,261,523 | B2* | 4/2019 | Khabbaz | G05D 7/0664 |
| 2007/0035907 | A1* | 2/2007 | Doering | A01G 25/162 361/160 |
| 2008/0319585 | A1* | 12/2008 | Nickerson | A01G 25/16 700/284 |
| 2013/0158724 | A1* | 6/2013 | Nickerson | G05D 7/0617 700/284 |

(Continued)

*Primary Examiner* — Jung Liu
(74) *Attorney, Agent, or Firm* — Bay State IP, LLC

(57) ABSTRACT

A system 1 for controlling a plurality of irrigation valves $2_1$, $2_2 \ldots 2_n$ is shown. The system receives 110 or 240 volts, mains voltage, electricity from the mains. This is applied to a 28 volt square wave generator 3, whose output is modulated in a modulator 4 under control of a control circuit 5. The modulated output is applied to a live line 6, receiving modulated positive and negative pulses of 28 volts with respect to a neutral line 7.

At each valve $2_1, 2_2 \ldots 2_n$, a respective decoder $8_1, 8_2 \ldots 8_n$ is provided. Live and neutral lines 10,11 pass from the decoders to the valves. Each decoder $8_n$ has an input connector 21 for the live and neutral pair 6,7 powering it and an output connector 22 for the further live and neutral pair 10,11 to the respective valve $2_n$.

22 Claims, 3 Drawing Sheets

(56) References Cited

U.S. PATENT DOCUMENTS

| | | | |
|---|---|---|---|
| 2013/0190935 A1* | 7/2013 | Nickerson | G05D 7/0676 700/284 |
| 2014/0249684 A1* | 9/2014 | Nickerson | G05B 19/042 700/284 |
| 2015/0060562 A1* | 3/2015 | Christiansen | A01G 25/16 239/1 |
| 2018/0141069 A1* | 5/2018 | Lemkin | G05D 7/0676 |
| 2018/0314223 A1* | 11/2018 | Nickerson | A01G 25/16 |

* cited by examiner

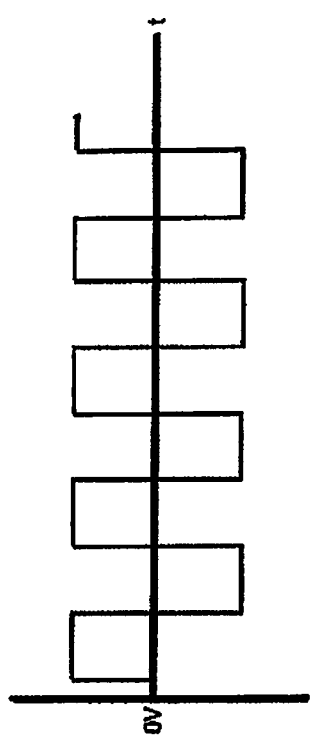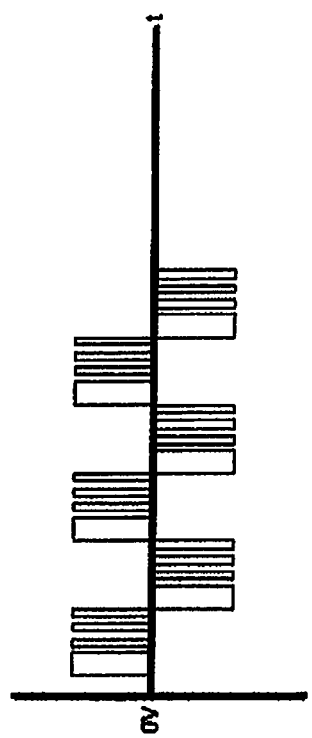

DECODER

CROSS REFERENCE TO RELATED APPLICATION

This application claims priority to and takes the benefit of British Patent Application No. GB1812452.9 filed on Jul. 31, 2019, the contents of which are herein incorporated by reference.

BACKGROUND OF THE INVENTION

Field of the Invention

The present invention relates to decoders, particularly, though not exclusively, for irrigation systems.

Description of the Related Art

Irrigation systems usually include controllers for turning irrigation valves and jet nozzles ON for a short period and then OFF for a longer period and so on. Conveniently the valves are normally closed solenoid valves, which open against water pressure in a main supplying the irrigation nozzles. It is convenient to power the solenoid valves with hard-wiring from a remote electrical supply. This in turn is vulnerable and apt to corrode, particularly where the valves are operated by DC. Further, voltage drop occurs over long wiring lengths.

As opposed to individual hard-wire pairs to each valve, it is known to provide a single pair of wires to multiple valves with each having a decoder to turn on its solenoid valve.

SUMMARY OF THE INVENTION

The object of the present invention is to provide an improved irrigation system decoder.

According to the invention there is provided a decoder for a device to be controlled in accordance with a control signal imposed as a modulation of an AC electricity supply to the decoder, the decoder comprising:
- a pair of input connection points for the AC electrical supply;
- a pair of output connection points for the device to be controlled;
- at least one power supply circuit connected to the input connection points;
- a processor unit powered for decoding modulation from the AC electrical supply and controlling passage of AC electricity to the device accordingly and
- at least one controlled circuit for passing electricity from the power supply to the device in accordance with control by the processor unit.

The processor unit could have its own power supply, but it is preferably powered by the power supply circuit of the decoder.

The frequency of the AC electricity supply to the device could be the same as that of the AC electricity supply to the decoder, but need not necessarily be so.

The modulation could comprise a single code, such as an identifier of the device to be controlled. In this case the processor unit can be programmed to change state and switch the device ON when OFF or vice versa. Where the device is an irrigation valve, the latter is held open until its code is sent and decoded the next time.

Alternatively, the modulation could comprise a second code, indicating a length of time that the valve is to be held ON, with the processor unit having a memory for this time and a clock for timing the length of the ON period, during which it holds the valve ON.

Again the modulation could include a code for causing the processor unit to switch between three states:
- Full ON as for drawing the valve against mains pressure to open it. This is short in practice, typically a few tens of milliseconds;
- Part ON for holding it open. This is much longer in practice, typically several minutes or tens of minutes;
- OFF.

These can be sent as commands to be acted on immediately or associated with times to be memorised by the processor unit in sequentially changing state.

Since the Full ON signal is required for a short period of time in comparison with the Part On signal, where the former is the opening the valve and the latter is for holding it open, a separate Part On modulation signal is not required, where the processor unit is programmed to apply the Full On signal for a period sufficient to open the valve and the Part On signal after the end of this period.

We can envisage the discrete decoding alternatives set out in claims 8 to 18.

The power supply could be such as to draw power, as required, from pulses of one polarity only or from both positive and negative pulses of the AC electricity supply. In the preferred embodiment, there are two power supplies, one drawing from positive pulses and the other from negative pulses.

There can be one or two controlled circuits. Preferably the controlled circuits are switches switching the power supplies to drive the load during pulses of the AC supply or a sufficient portion thereof to apply the requisite current for the requisite time to the device to actuate it fully or partially. In such case, the valves are preferably such as to be able to open, in the case of a Full On signal, with an RMS power less than that represented by continuous connection of the AC electricity available at the input to the decoder. This enables the processor unit to switch the regulators to supply the valve with a lesser duty cycle than that of continuous connection, whereby when the voltage drops remote from the mains supply, the duty cycle can be increased, to the requisite RMS power at lower voltage. This arrangement economises on power drawn from the mains, allowing it to reach further along the supply line with useful voltage.

Preferably the power supplies include capacitors, with diodes arranged to allowing charging of the capacitors during respective pulses and blocking discharge therebetween. The capacitors maintain a +ve voltage on the +ve power supply line when the input pulse is zero and similarly for the -ve power supply line, enabling a greater than the pulse voltage to be available to drive current in the valve's coil.

In the preferred embodiment, each decoder has an uninterrupted neutral path through it. Thus in a system using them the neutral line provides interconnection of all the valves' solenoid coils in the manner of an earth of a normal mains voltage system.

BRIEF DESCRIPTION OF THE DRAWINGS

To help understanding of the invention, a specific embodiment thereof will now be described by way of example and with reference to the accompanying drawings, in which:

FIG. 3 is a graph of the voltage on the supply line of the system; and

FIG. 4 is a plot of the AC live voltage at a valve coil where regulation of electricity to the coil is at the frequency on a live and neutral pair of the system.

DETAILED DESCRIPTION OF THE SEVERAL EMBODIMENTS

Figure 1:
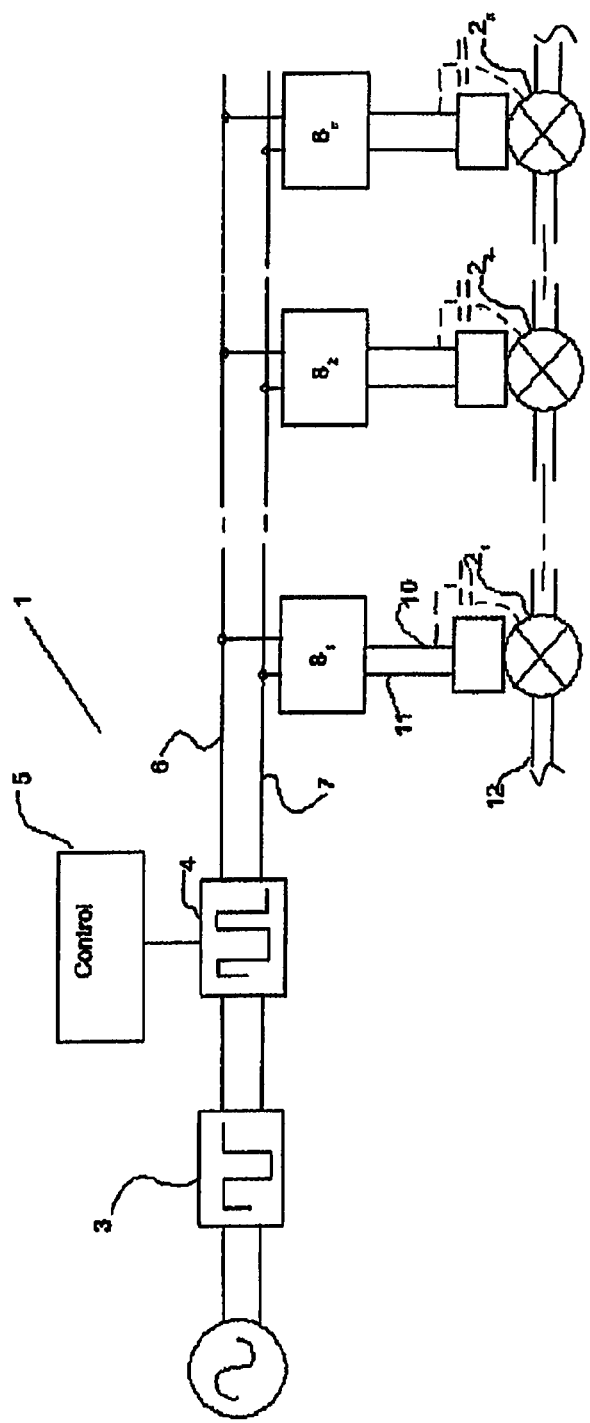
FIG. 1 is a diagram of an irrigation system including decoders in accordance with the invention.
Figure 2:
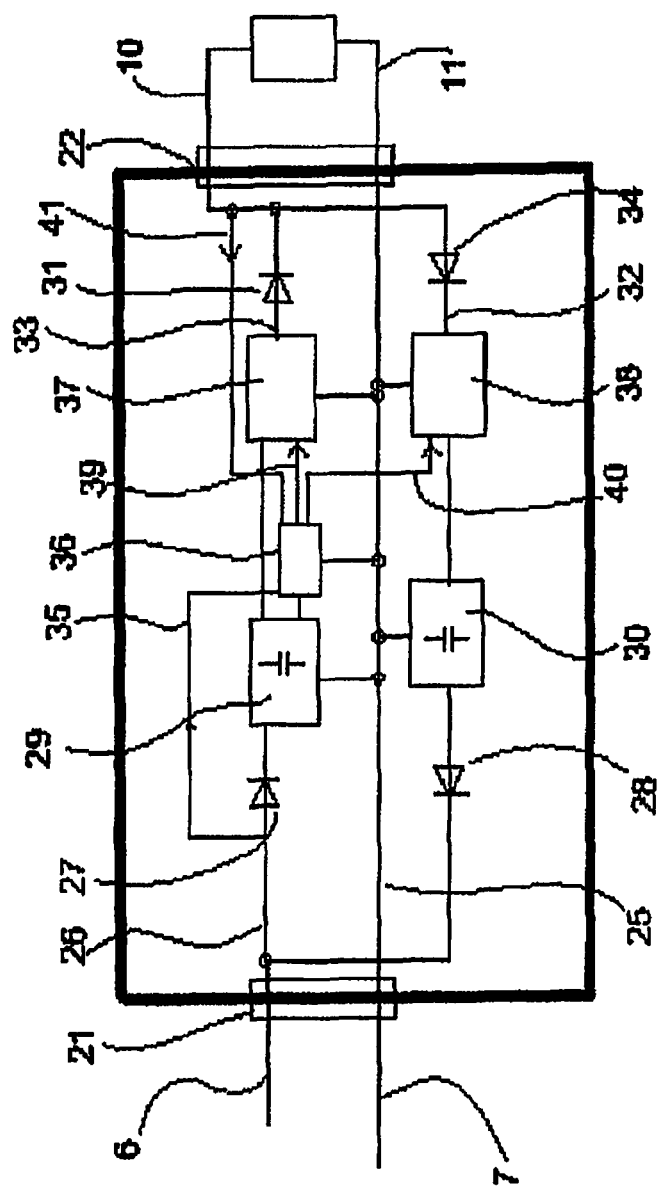
FIG. 2 is a block diagram of a decoder of the invention.

Referring to the drawings, a system 1 for controlling a plurality of irrigation valves $2_1, 2_2 \ldots 2_n$ is shown. The system receives 110 or 240 volts, mains voltage, electricity from the mains. This is applied to a 28 volt square wave generator (56 volt peak to peak) 3, whose output is modulated in a modulator 4 under control of a control circuit 5. The modulated output is applied to a live line 6, receiving modulated positive and negative pulses of 28 volts with respect to a neutral line 7, which can be thought of as an unimpeded zero volts line.

At each valve $2_1, 2_2 \ldots 2_n$, a respective decoder $8_1, 8_2 \ldots 8_n$ is provided. Live and neutral lines 10,11 pass from the decoders to the valves. At the valves, the neutral line is normally isolated from the body of the valve, which is in contact with the water in a main 12. There is however capacitance between the body and the neutral line. Should lightning induce voltage surge in the water in the main, the neutral/body capacitance—shown in ghost in FIG. 1—provides a route to earth. Thus the decoder is given some measure of protection by the neutral line being continuous and periodically earthed as at the modulator 4.

Each decoder $8_n$ has an input connector 21 for the live and neutral pair 6,7 powering it and an output connector 22 for the further live and neutral pair 10,11 to the respective valve $2_n$. The neutral line 11 passes via a neutral bus 25 in the decoder to the neutral line 7.

Connected to the live line 26 in the decoder, via respective diodes 27,28 are positive and negative power supplies 29,30. These include capacitors, not shown separately. The live line 26 passes through the power supplies to +ve and −ve supply lines. The diodes 31,34 disconnect the these latter lines from the live line when the voltage on it inverts as a +ve pulse becomes a −ve pulse and vice versa respectively. The capacitors in the power supplies, are connected between the neutral line 7 and the common point of the live line and the respective supply lines. Thus the capacitors maintain voltage on the supply lines when the voltage on the live line has inverted. Other aspects of their function are described below.

A supplementary live line 35 bypasses the power supplies to pass the modulation on the live line 6 to a demodulating processor 36 having a memory for its identification code and a control signal causing it to control +ve and −ve device regulators 37,38, via respective lines 39,40. When it applies a high signal on these lines, the regulators pass current from the power supplies to the controlled valve. This is via the output diodes 31,34, provided to avoid current from one regulator passing back into the other.

The +ve and −ve regulators can be switched ON in phase with the respective +ve and −ve pulses on the live line 6. The valve then receives AC pulses for its operation. The voltage of the pulses will be the line voltage, subject only to this falling off where the lines 6,7 are long and when the capacitor discharge falls below nominal line voltage 6. The regulators imposed modulation from the processor 36 as described below.

The voltages at various points are shown in FIGS. 3 and 4. FIG. 3 shows the pulse modulated voltage on the line 6. The modulation as such cannot be seen in FIG. 3, and indeed is present for only a proportion of the time, but is in the form of variation of the mark-space ratio. FIG. 4 shows that voltages at the outputs on the line 10 from the regulators 37,38, i.e. that is on the remote side of diodes 31,34 from the outputs of the regulators.

We prefer to operate the solenoid valves at the same frequency AC as the mains frequency, with a higher frequency modulation superimposed on it.

When a particular decoder receives at its demodulator 36 its code, followed by a full ON signal, it switches the regulators on to pass the positive and negative pulses to the actuating coil of the respective valve. The demodulator is programmed to apply a sufficient, full ON power to the coil to draw the valve open against the water pressure in the water main 12. The power is determined from the specified RMS voltage of the coil. A feedback signal 41 is used to verify that the coil is passing the intended RMS current. The processor adjusts the modulation applied to provide the required power to open the valve. More specifically, the voltage applied in each pulse from the power supply, i.e. that locally of the line 6 as maintained by the capacitor of the power supply, is applied as a wide pulse of around one third of the pulse length, followed by a number—three as shown in FIG. 4—narrower pulses within the line 6 pulse width. It is the RMS value of the wide and narrow pulses that determines the power supplied to the coil.

The system will normally be designed such that at the remote end of the line, where the voltage between the live and neutral pair 6,7 will have dropped, a sufficient power can be supplied to a local valve's coil to provide the requisite full ON power to open the valve, with a small amount of modulation applied, for instance the wide pulse extending for most of the pulse width in FIG. 4 and a single small pulse only. The processor is programmed to adjust the duty cycle of the modulation in accordance with the voltage available locally to the decoder.

The valve can be expected to open within about 50 msec of the Full ON power being applied to it. In practice, to provide a margin for error, the Full ON power is applied for approximately 100 msec, that is 5 50 Hz/20 msec pulses. Then, in the sequence of operation, and the demodulator switches automatically to reduced power, part ON, operation. This reduces the duty cycle of the modulation, taking account of the voltage available to the valve, to reduce the current and power to a level at which the valve remains open but without consuming the current requisite for it to open from closed.

After the required part ON time, demodulator switches OFF, i.e. applying no voltage to the supply lines, with the result that the valve closes and irrigation ceases at this valve.

This way of operating reduces the current drawn by the demodulators in comparison with the valves drawing the full ON current at all times that they are open.

The system is preferably configured such that the demodulator, regulators and valve nearest to the mains connection and square wave generator is able to supply full ON current for the valve to open at a significantly lower duty cycle, with the local voltage between the live and neutral lines not depleted as it is further down the lines. The corollary is that at the far end of the line, the valve there can be operated at the voltage available there at a duty cycle closer to 100%. Although it receives less voltage, it is still able to perform its function, particularly in being opened.

It should be noted that the Full ON signal will normally be received at a decoder after a period of being OFF, whereby its capacitors are fully charged so as to maintain the local line voltages at the regulators throughout the respective line voltage pulses. Further the controller will normally be programmed to provide a delay between opening of any two valves, to provide the local capacitors the opportunity to be fully charged.

Two further functions of the capacitors are to provide for absorption of back-emf when the current to the solenoid coil is switched off and to provide for enough local energy for reliable transmission of the decoders state back to the control circuit.

The AC frequency at which the regulators are driven can equal that of the mains voltage frequency. Alternatively the regulators can be switched at a higher frequency.

The invention is not intended to be restricted to the details of the above described embodiment. For instance in an alternative to the Part ON regulation being started automatically after a set time, the controller could send a second identifying code and reduced power, part ON, signal to the demodulator. This then reduces the duty cycle of the modulation, taking account of the voltage available to the valve, to reduce the current and power to a level at which the valve remains open but without consuming the current requisite for it to open from closed. After the required part ON time, the controller sends the demodulator an OFF signal, in response to which the regulators are maintained OFF, i.e. applying no voltage to the supply lines.

What is claimed is:

1. A decoder for a device to be controlled in accordance with a control signal imposed as a modulation of an AC electricity supply to the decoder, the decoder comprising:
   a pair of input connection points for the AC electrical supply;
   a pair of output connection points for the device to be controlled;
   at least one power supply circuit connected to the input connection points;
   a processor unit powered for decoding modulation from the AC electrical supply and controlling passage of AC electricity to the device accordingly and
   at least one controlled circuit for passing electricity from the power supply to the device in accordance with control by the processor unit;
   wherein:
   the processor unit is adapted to decode single code modulation and
   the processor unit has:
      a memory for a predetermined ON period and a predetermined partially-ON period and
      a clock for timing the length of the ON period and the partially-ON period,
   the arrangement being such that:
      the processor unit changes state on receipt of the single code for the device to switch it ON when OFF and holds it on for the length of the ON period and
      the processor unit changes to a partially-ON state for retaining the device switched on for the partially-ON period indicated and switches the device OFF.

2. A decoder according to claim 1, including a discrete power supply for the processor unit.

3. A decoder according to claim 1, wherein the processor unit is connected to be powered by the said at least one power supply.

4. A decoder according to claim 1, wherein the said at least one power supply is connected to draw power from pulses of one polarity only or from both positive and negative pulses of the AC electricity supply.

5. A decoder according to claim 1, wherein the said at least one power supply is comprised of two power supplies, one drawing from positive pulses of the AC electricity supply and the other from negative pulses thereof.

6. A decoder according to claim 1, wherein the or each power supply include a respective capacitor and at least one diode arranged to allowing charging of its capacitor during respective pulses and blocking discharge therebetween.

7. A decoder according to claim 1, adapted and arranged to supply AC electricity to the device at the frequency of AC electricity supply to the decoder.

8. A decoder according to claim 1, wherein the processor unit is adapted to decode single code modulation, changing state on receipt of a code for the device to switch it ON when OFF and vice versa.

9. A decoder according to claim 1, wherein:
   the processor unit is adapted to decode one code modulation and
   the processor unit has:
      a memory for a preset ON period and
      a clock for timing the length of the ON period,
   the arrangement being such that the processor unit changes state on receipt of a code for the device to switch it ON when OFF and holds it on for the length of the ON period as memorised.

10. A decoder according to claim 1, wherein:
    the processor unit is adapted to decode one code modulation and
    the processor unit has:
       a memory for a preset ON period and
       a clock for timing the length of the ON period,
    the arrangement being such that the processor unit changes state on receipt of a code for the device to switch it ON when OFF and holds it on for the length of the ON period as memorised.

11. A decoder according to claim 1, wherein the processor unit is adapted to receive a code identifying that the subsequent codes to be decoded are intended for it as opposed to another decoder.

12. A decoder according to claim 1, wherein the controlled circuits are switches switching the output of each power supply to drive the device during pulses of the AC supply or a sufficient portion thereof to apply the requisite current for the requisite time to the device to actuate it fully ON or at least hold it partially-ON.

13. A decoder according to claim 1, including means for modulating power supplied to the device and means for measuring the power drawn by the device, the processor unit being adapted to modify the RMS value of the supplied power maintain sufficient power for operation of the device.

14. A decoder for a device to be controlled in accordance with a control signal imposed as a modulation of an AC electricity supply to the decoder, the decoder comprising:
    a pair of input connection points for the AC electrical supply;
    a pair of output connection points for the device to be controlled;
    at least one power supply circuit connected to the input connection points;
    a processor unit powered for decoding modulation from the AC electrical supply and controlling passage of AC electricity to the device accordingly and
    at least one controlled circuit for passing electricity from the power supply to the device in accordance with control by the processor unit;
    wherein:
    the processor unit is adapted to decode two code modulation and the processor unit has:
a memory for a predetermined ON period and
a clock for timing the length of the ON period,
the arrangement being such that:
the processor unit changes state on receipt of a first code for the device to switch it ON when OFF and holds it on for the length of the ON period and
the processor unit changes to a partially-ON state for retaining the device switched on until the unit changes state on receipt of the second code to switch the device OFF.

15. A decoder for a device to be controlled in accordance with a control signal imposed as a modulation of an AC electricity supply to the decoder, the decoder comprising:
a pair of input connection points for the AC electrical supply;
a pair of output connection points for the device to be controlled;
at least one power supply circuit connected to the input connection points;
a processor unit powered for decoding modulation from the AC electrical supply and controlling passage of AC electricity to the device accordingly and
at least one controlled circuit for passing electricity from the power supply to the device in accordance with control by the processor unit;
wherein:
the processor unit is adapted to decode a single code modulation for switching between ON, partially-ON and OFF states,
the arrangement being such that:
the processor unit changes state on first receipt of the code for the device to switch it ON when OFF and holds it on and then
the processor unit changes state on second receipt of the code for the device to switch it partially-ON and holds it on and then
the processor unit changes state on third receipt of the code for the device to switch it OFF.

16. A decoder for a device to be controlled in accordance with a control signal imposed as a modulation of an AC electricity supply to the decoder, the decoder comprising:
a pair of input connection points for the AC electrical supply;
a pair of output connection points for the device to be controlled;
at least one power supply circuit connected to the input connection points;
a processor unit powered for decoding modulation from the AC electrical supply and controlling passage of AC electricity to the device accordingly and
at least one controlled circuit for passing electricity from the power supply to the device in accordance with control by the processor unit;
wherein:
the processor unit is adapted to decode two code modulation,
the arrangement being such that:
the processor unit changes state on receipt of a first of the codes for the device to switch it ON when OFF and holds it on
the processor unit changes state on receipt of a second of the codes for the device to switch it OFF when ON.

17. A decoder for a device to be controlled in accordance with a control signal imposed as a modulation of an AC electricity supply to the decoder, the decoder comprising:
a pair of input connection points for the AC electrical supply;
a pair of output connection points for the device to be controlled;
at least one power supply circuit connected to the input connection points;
a processor unit powered for decoding modulation from the AC electrical supply and controlling passage of AC electricity to the device accordingly and
at least one controlled circuit for passing electricity from the power supply to the device in accordance with control by the processor unit;
wherein:
the processor unit is adapted to decode two code modulation and
the processor unit has:
a memory for an ON period and
a clock for timing the length of the ON period,
the arrangement being such that the processor unit changes state on receipt of a first code for the device to switch it ON when OFF and holds it on for the length of the ON period as memorised on receipt of second code indicating the ON period.

18. A decoder according to claim 14, including an uninterrupted neutral path there-through.

19. A decoder for a device to be controlled in accordance with a control signal imposed as a modulation of an AC electricity supply to the decoder, the decoder comprising:
a pair of input connection points for the AC electrical supply;
a pair of output connection points for the device to be controlled;
at least one power supply circuit connected to the input connection points;
a processor unit powered for decoding modulation from the AC electrical supply and controlling passage of AC electricity to the device accordingly and
at least one controlled circuit for passing electricity from the power supply to the device in accordance with control by the processor unit;
wherein:
the processor unit is adapted to decode two code modulation and
the processor unit has:
a memory for a predetermined ON period and a partially-ON period and
a clock for timing the length of the ON period and the partially-ON period,
the arrangement being such that:
the processor unit changes state on receipt of a first code for the device to switch it ON when OFF and holds it on for the length of the ON period and
the processor unit changes to a partially-ON state for retaining the device switched on for the partially-ON period as memorised on receipt of second code indicating the partially-ON period.

20. A decoder for a device to be controlled in accordance with a control signal imposed as a modulation of an AC electricity supply to the decoder, the decoder comprising:
a pair of input connection points for the AC electrical supply;
a pair of output connection points for the device to be controlled;
at least one power supply circuit connected to the input connection points;

a processor unit powered for decoding modulation from the AC electrical supply and controlling passage of AC electricity to the device accordingly and at least one controlled circuit for passing electricity from the power supply to the device in accordance with control by the processor unit;

wherein:

the processor unit is adapted to decode three code modulation, the arrangement being such that:

the processor unit changes state on receipt of a first of the three codes for the device to switch it ON when OFF and holds it on and then the processor unit changes state on receipt of a second of the three codes for the device to switch it partially-ON when ON and holds it on and then the processor unit changes state on receipt of a third of the three codes for the device to switch it OFF.

21. A decoder for a device to be controlled in accordance with a control signal imposed as a modulation of an AC electricity supply to the decoder, the decoder comprising:

a pair of input connection points for the AC electrical supply;

a pair of output connection points for the device to be controlled;

at least one power supply circuit connected to the input connection points;

a processor unit powered for decoding modulation from the AC electrical supply and controlling passage of AC electricity to the device accordingly and at least one controlled circuit for passing electricity from the power supply to the device in accordance with control by the processor unit;

wherein:

the processor unit is adapted to decode three code modulation and the processor unit has:

a memory for an ON period and a partially-ON period and a clock for timing the length of the ON period and a partially-ON period, the arrangement being such that:

the processor unit changes state on receipt of a first of the three codes for the device to switch it ON when OFF and holds it on for the length of the ON period as memorised on receipt of second code indicating the length of the ON period and then the processor unit changes to a partially-ON state for retaining the device switched on and holds it on for the length of the partially-ON period as memorised on receipt of third code indicating the length of the partially-ON period.

22. A decoder according to claim 1, the comprising:

the plurality of decoders, arrangeable in series along a cable, a plurality of irrigation valves as controlled devices, an AC wave generator for supplying the decoders via the cable, and a modulator for modulating the AC wave applied to the cable from the generator for controlling operation of the respective irrigation valves.

\* \* \* \* \*